United States Patent [19]
Kelly

[11] Patent Number: 5,432,345
[45] Date of Patent: Jul. 11, 1995

[54] METHOD AND APPARATUS FOR CONTROL OF SURFACE POTENTIAL

[76] Inventor: Michael A. Kelly, 35 Lerida Ct., Portola Valley, Calif. 94028

[21] Appl. No.: 958,249

[22] Filed: Oct. 8, 1992

[51] Int. Cl.⁶ ............................................. H01J 37/00
[52] U.S. Cl. .................................. 250/306; 250/307; 250/251; 250/492.3
[58] Field of Search ............ 250/306, 307, 251, 492.3, 250/492.2, 398

[56] References Cited

U.S. PATENT DOCUMENTS

| | | | |
|---|---|---|---|
| 4,052,614 | 10/1977 | Fletcher et al. | 250/306 |
| 4,453,086 | 6/1984 | Grobman | 250/307 |
| 4,939,360 | 7/1990 | Sakai | 250/251 |

*Primary Examiner*—Paul M. Dzierzynski
*Assistant Examiner*—Kiet T. Nguyen
*Attorney, Agent, or Firm*—William Green & Associates

[57] ABSTRACT

Electron or ion spectroscopy methods are commonly used for the surface analysis of insulating materials. During the illumination of the surface, electrons are emitted leaving behind a positively charged surface. The positively charged surface causes the energy of the emitted electrons to change and interferes with the analysis of their energy spectra. Conventionally, a source of neutralizing low energy electrons is directed to the illuminated region of the surface to neutralize the positive surface charge. The addition, to the non-illuminated region of the material, of a flux of positive particles or a means of emitting negative particles causes a discharge of the positive charge from the illuminated area of the material and establishes a dynamic equilibrium over the surface of the entire specimen. This permits the surface to be maintained at an arbitrarily uniform level controlled by the relative fluxes of the emitted electrons, the neutralizing electron flux, and the discharging means.

9 Claims, 3 Drawing Sheets

METHOD AND APPARATUS FOR CONTROL OF SURFACE POTENTIAL

BACKGROUND OF THE INVENTION

1. Field of the Invention

This invention relates in general to electron spectroscopic analysis of material surfaces and in particular to the electron spectroscopic analysis of the surfaces of electrically insulating materials by illuminating specimens to cause the emission of electrons which may be analyzed to determine the characteristics of the surfaces.

2. Brief Description of the Prior Art

It is known that the surface analysis of insulating materials by electron or ion spectroscopy is hampered by the buildup of positive charges on the surface. For example, in X-Ray Photoelectron Spectroscopy (XPS), a beam of x-rays illuminates a portion of a specimen, causing electrons to be emitted. These emissions are analyzed to determine the composition of the surface.

The emission of electrons from the surface leaves the surface positively charged. The positive charge causes the energy of the emitted electrons to change and makes the interpretation of their energy spectra difficult. In addition, if the x-ray beam is focused on the specimen so that its intensity varies from one location to another, the spectrum of the electrons is smeared out in energy and much of the information contained in the spectrum is lost.

A number of solutions to this problem are currently used in commercial instrumentation, most of which involve illuminating the sample with a beam of low energy electrons to neutralize the positive charges on the specimen surface. In many cases such solutions are acceptable, but in the case of very non-uniform x-ray beams such as those found in monochromatized instruments, the neutralization is not good enough to analyze many materials. Additional solutions have been developed such as the positioning of an electrically conductive grid close to the surface of the sample to smooth gradients in the electrical potential in the region of the x-ray beam spot, but these work only in a limited number of cases.

In a typical XPS spectrometer, a nonuniform beam of x-rays illuminates a specimen, and the photoemitted electrons are energy analyzed to determine the elements and chemical compounds present in the specimen. If the specimen is insulating, the surface potential becomes increasingly positive as electrons leave, until it becomes positive enough to attract other electrons present in the ambient environment. As a consequence, the surface potential becomes nonuniform, with areas receiving the most x-rays being the most positive. A typical electron beam neutralizer is an electron gun, usually a simple heated tungsten filament with an electrostatic lens. The gun floods the specimen surface with electrons, thereby charging that surface to approximately the energy of the electrons, at which point the electrons can no longer energetically reach the specimen. Where the x-rays illuminate the specimen, a dynamic equilibrium is established, in which the surface potential is that value for which the electron fluxes to and from the specimen are equal.

However, the portion of the specimen which is not illuminated by the x-ray beam will charge to the potential of the most energetic electrons in the environment, since without the x-rays, there is no mechanism for an electron, once reaching the surface, to leave. This creates a situation in which electrons from the flooding beam, trying to reach the region which the x-rays are striking to cancel the positive surface charge, are repelled by the surrounding surface which is negatively charged. As a consequence, a considerably nonuniform potential develops on the specimen surface. Attempts to focus the electron beam to the area illuminated by the x-rays are not effective, because the electrons are defocused as they are repelled by the specimen.

SUMMARY OF THE INVENTION

This invention provides an improved method and device for analyzing electron emissions in insulating materials, such as polymers, glasses, and semiconductors.

The improvement is the combination of the prior art step of flooding the surface of the sample with a primary beam of neutralizing low energy electrons, with the new step of establishing either a flux of positive particles or a means of emitting negative particles on the non-illuminated areas of the material thereby neutralizing the excessive negative charge in those areas, and hence allowing the neutralizing electron beam to discharge the positive charge from the illuminated area of the material and contemporaneously create a dynamic equilibrium over the surface of the entire specimen. This permits the surface to be maintained at an arbitrarily uniform level, controlled by the relative fluxes of the illuminating beam, the emitted electrons and the discharging means.

It has also been found that by making the primary neutralizing electron beam as monoenergetic as possible, less excess negative charge accumulates on the non-illuminated areas of the specimen. However there are always some higher energy electrons present in the beam or in the environment which cause that portion of the specimen not illuminated by the x-rays to charge to a more negative potential than that of the illuminated region, so that this embodiment is not the preferred embodiment.

In addition it has been found that an improved analysis within a spectrometer chamber is obtained by adjusting the energy of the primary neutralizing beam so that it is below the potential required for the flooding electrons to strike the conducting walls of the spectrometer. This adjustment causes electrons emitted by the flooding gun to form a space charge in the spectrometer chamber and will increase the number of neutralizing electrons which reach the specimen.

DETAILED DESCRIPTION OF THE INVENTION

Figure 1:
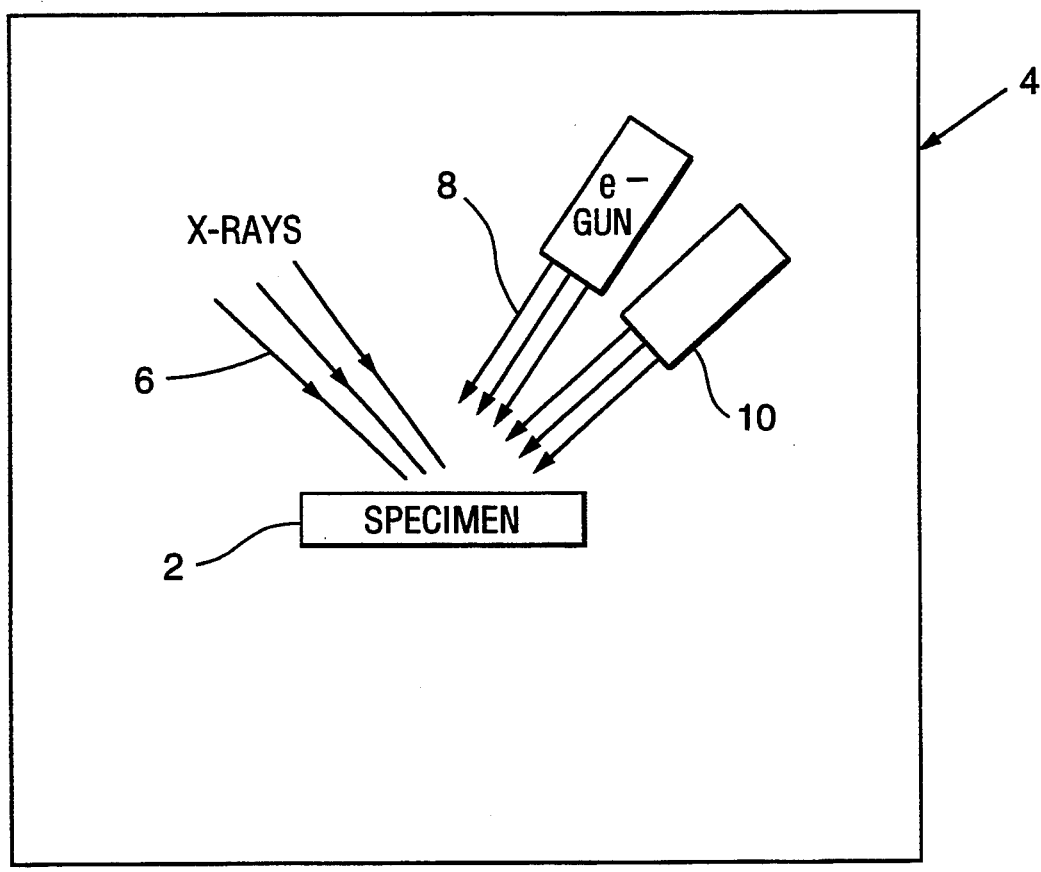
FIG. 1 is a diagram illustrating the invention a typical XPS spectrometer.

FIG. 1 shows a preferred embodiment of this invention. An insulating specimen 2 is mounted in the vacuum chamber of a spectrometer 4. X-rays 6 are directed toward the specimen and illuminate the specimen. An electron gun 8, emits low energy electrons and floods the specimen. A discharge beam, for example, a source of ultraviolet photons or positively charged particles 10 also illuminates the specimen.

In a typical configuration the x-ray flux is on the order of $10^9$ photons/sec in an area of 10 mm$^2$ or less, and the current from the electron gun is 10 microamperes and its potential between $-5$ V and $+20$ V with respect to the spectrometer chamber. The ultraviolet light illuminates an area larger than the x-ray source, on the order of 10 cm$^2$ or less, and has a flux of $10^8$ to $10^{13}$ photons/sec at a wavelength short enough to cause electron emission from the specimen, approximately 1500–2500 angstroms.

Figure 2:
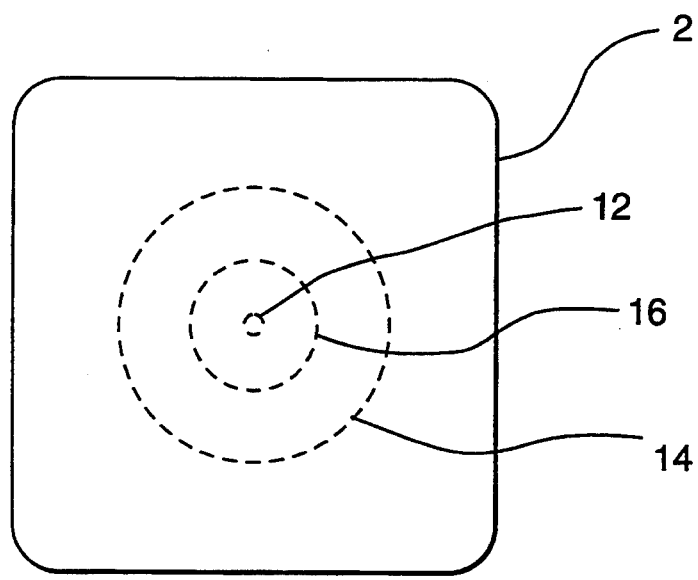
FIG. 2 shows the surface of the insulating specimen of FIG. 1

FIG. 2 is a top view of the surface of the insulating specimen of FIG. 1. A region 12 of insulating specimen 2 is illuminated by the x-ray source. The neutralizing beam of low energy electrons would strike flood area 14, usually larger than region 12 producing an excess of negative charge in the non-illuminated area. This excess negative charge repels flooding electrons directed toward region 12, causing incomplete neutralization. The secondary, or discharging beam strikes area 16 and reduces the excess negative charge in that area to a negligible value. Although in this illustration area 16 is shown as smaller than the flooded area, the discharging beam may be directed to an area larger or smaller than the area illuminated by the neutralizing electron beam.

In a typical XPS spectrometer, region 12 may have a diameter of 0.5 mm or smaller; area 14 may have a diameter of 0.1 to 10 cm; and area 16 a diameter of 0.5 to 2 cm.

Figure 3:
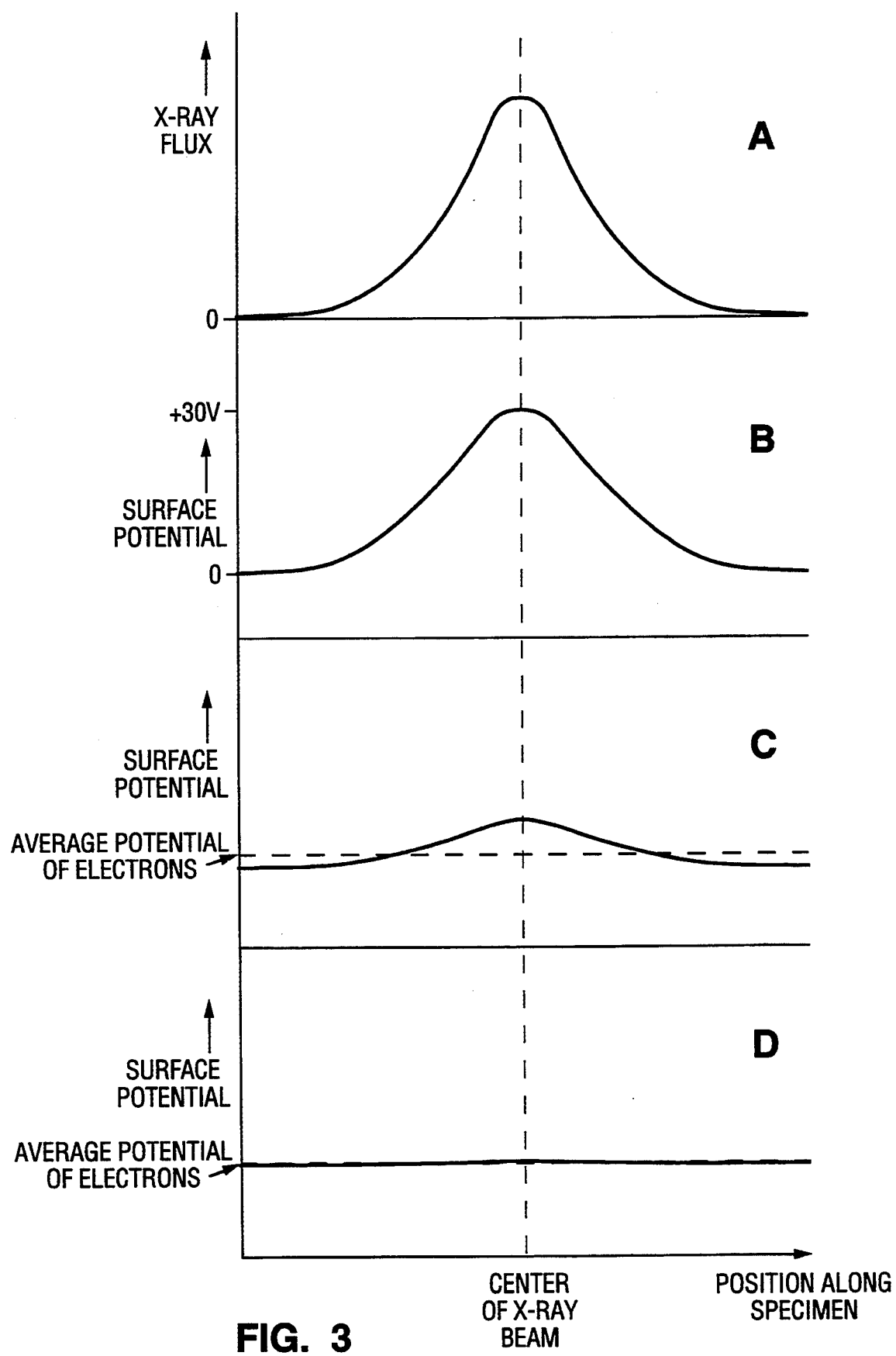
FIG. 3 is a series of flux patterns illustrating the surface potential at the center of the x-ray beam under varying conditions.

Referring to FIG. 3, Curve A represents the x-ray flux as a function of position from a typical nonuniform x-ray beam as it strikes a specimen.

Curve B shows the resulting surface potential with both the electron and photon beams turned off. At the center of the x-ray beam, this potential is positive enough to attract neutralizing electrons from the ambient environment and can be as high as 30 volts.

Curve C shows the resulting surface potential with the electron beam on. The variation in surface potential is significantly reduced, but the region of the specimen surface not illuminated by the x-rays is charged negatively, to the potential of the highest energy electrons present in the environment. This negative potential repels the majority of the electrons present in the flooding beam, so that the region being illuminated by the x-rays is imperfectly neutralized.

Curve D shows the resulting surface potential with both the electron and photon beams turned on. As a result the negative charges are discharged, making it possible for neutralizing electrons to reach the illuminated region and thus reduce the variation in surface potential.

The reduction of the surface potential as illustrated in Curve D, permits the specimen surface potential to be controlled within a range of a few tenths of a volt. This uniformity enables useful spectra to be taken from almost all insulating materials.

I claim:

1. In a method for analyzing an electrically insulating material in which a region of a sample surface is illuminated by a beam of photons or positively charged particles to cause the emission of electrons from said region resulting in said region becoming positively charged, the steps of:

flooding the illuminated region of the sample surface with a beam of neutralizing low energy electrons; and concurrently applying a means for discharging an excess negative charge on an area of the sample surface surrounding said illuminated region;

whereby the negative charges of the area adjacent to the illuminated region, arising from the flooding electron beam, are discharged, the repelling of the electrons in the neutralizing beam is reduced, and a uniform surface potential is provided to permit enhanced measurement of the emissions from the sample surface.

2. A method according to claim 1, wherein the discharging means is a secondary illumination directed to the sample surface, said secondary illumination causing photoemission from the sample surface.

3. A method according to claim 2, wherein said discharging means is a beam of ultraviolet light.

4. A method according to claim 1, wherein the discharging means is a secondary illumination directed to the area of the sample surface surrounding said illuminated region, said secondary illumination causing photoemission from the sample surface.

5. A method according to claim 4, wherein said discharging means is a beam of ultraviolet light.

6. A method according to claim 1, wherein said discharging means is a neutralizing flux consisting of a beam of positive ions directed to the area of the sample surface adjacent to the region of the sample surface being illuminated, thereby neutralizing the adjacent area.

7. In a method for analyzing an electrically insulating material in which a region of a sample surface is illuminated by a beam of photons or positively charged particles to cause the emission of electrons from said region resulting in said region becoming positively charged, the steps of:

flooding the illuminated region of the sample surface with a beam of neutralizing low energy electrons, wherein said low energy electrons are provided by an electron source which emits nearly monoenergetic electrons;

applying a means for discharging an excess negative charge on an area of the sample surface surrounding said illuminated region, wherein said excess negative charge is created by said neutralizing low energy electron beam;

whereby the excess negative charge which accumulates on the sample surface surrounding said illuminated region is reduced.

8. In a method for analyzing an electrically insulating material, positioned within a spectrometer chamber, in which a region of a sample surface is illuminated by a beam of photons or positively charged particles to cause the emission of electrons from said region resulting in said region becoming positively charged, the steps of:

flooding the illuminated region of said sample surface with a beam of neutralizing low energy electrons; the source of said electrons having a positive potential with respect to said spectrometer chamber to increase the electron flux to the sample surface and applying a means for discharging an excess negative charge charge on an area of said sample surface surrounding said illuminated region, wherein said excess negative is created by said neutralizing low energy electron beam.

9. A device for establishing a nearly uniform surface region potential on a specimen mounted in an x-ray photoelectron spectrometer and illuminated by an x-ray beam to cause an emission of electrons for spectroanalysis, consisting of:
   (a) means for flooding said illuminated region of said specimen surface with a beam of neutralizing low energy electrons;
   (b) means for discharging a resulting negative charge of an area adjacent to the illuminated region of said specimen wherein said resulting negative charge is created by said neutralizing low energy electron beam;

whereby the repelling of the electrons in the neutralizing beam is reduced, and the surface potential is reduced and maintained in a uniform state to permit enhanced measurement of the emissions from the sample surface.

* * * * *